United States Patent [19]

Harvey et al.

[11] Patent Number: 5,895,934
[45] Date of Patent: Apr. 20, 1999

[54] NEGATIVE DIFFERENTIAL RESISTANCE DEVICE BASED ON TUNNELING THROUGH MICROCLUSTERS, AND METHOD THEREFOR

[75] Inventors: James F. Harvey, Apex, N.C.; Robert A. Lux, Toms River, N.J.; Raphael Tsu, Charlotte, N.C.

[73] Assignee: The United States of America as represented by the Secretary of the Army, Washington, D.C.

[21] Appl. No.: 08/915,547

[22] Filed: Aug. 13, 1997

[51] Int. Cl.$^6$ ............................................. H01L 29/88
[52] U.S. Cl. .................................... 257/49; 257/199
[58] Field of Search ............................. 257/21, 22, 25, 257/49, 199

[56] References Cited

U.S. PATENT DOCUMENTS

| | | | |
|---|---|---|---|
| 3,277,313 | 10/1966 | Unterkofler | 257/25 |
| 5,051,786 | 9/1991 | Nicollian et al. | 257/22 |
| 5,206,523 | 4/1993 | Goesele et al. | 257/21 |
| 5,606,177 | 2/1997 | Wallace et al. | 257/25 |

*Primary Examiner*—Olik Chaudhuri
*Assistant Examiner*—William David Coleman
*Attorney, Agent, or Firm*—Michael Zelenka; George B. Tereschuk

[57] ABSTRACT

A solid state electronic device exhibiting negative differential resistance is fabricated by depositing a thin layer of amorphous silicon on a single crystal substrate, doped $N^+$. The amorphous silicon is simultaneously crystallized and oxidized in a dry $N_2$ and $O_2$ mixture. The result is a layer of amorphous $SiO_2$ surrounding microclusters of crystalline silicon. A layer of polycrystalline silicon is deposited to a thickness of approximately 0.5 micron. Ohmic metal contacts are made to the top and bottom. These active layers are isolated by insulating $SiO_2$. A bias voltage applied between the metal contacts results in negative differential resistance due to tunneling through resonant energy levels in microclusters.

5 Claims, 2 Drawing Sheets

NEGATIVE DIFFERENTIAL RESISTANCE DEVICE BASED ON TUNNELING THROUGH MICROCLUSTERS, AND METHOD THEREFOR

GOVERNMENT INTEREST

The invention described herein may be manufactured, used, imported and licensed by or for the Government of the United States of America without the payment to us of any royalty thereon.

FIELD OF THE INVENTION

The invention relates to solid state electronics, and in particular to an improved high-frequency solid state device with negative differential resistance.

BACKGROUND OF THE INVENTION

Modern microwave and millimeter wave technology requires solid state sources, mixers, and amplifiers which can operate at extremely high frequency, which have low-noise characteristics, and which can be integrated in an IC (integrated circuit) technology. Devices for the highest frequencies generally must be made from GaAs, or other III-V IC's, which are much more expensive than silicon IC's. Alternatively, the III-V device can be hybridized with silicon IC's, which introduces difficult and expensive processing steps.

A resonant tunnel diode (RTD), made from either silicon or a III-V semiconductor, has a Negative Differential Resistance (NDR) in its I-V characteristic and as a result has the capability of operation as an oscillator, an amplifier, or a mixer at extremely high frequencies with reasonable current density and with very low noise. Such RTD's must be fabricated with an epitaxial growth technique such as MBE, MOCVD, MOMBE, etc. Devices made using these techniques will be expensive and difficult to integrate with a less-expensive IC technology.

OBJECTS AND SUMMARY OF THE INVENTION

It is therefore an object of the invention to provide a solid state device with negative differential resistance which can be easily and inexpensively fabricated and which has the capability of extremely high frequency operation (e.g., 100 Ghz and above) with low noise.

The invention uses tunneling through resonant energy levels in microclusters to achieve NDR, and hence oscillator, amplifier, and mixer, devices. A thin layer of amorphous silicon is deposited on a single crystal substrate, doped $N^+$. The amorphous silicon is simultaneously crystallized and oxidized in a dry $N_2$ and $O_2$ mixture. The result is a layer of amorphous $SiO_2$ surrounding microclusters of crystalline silicon. A layer of Polycrystalline silicon is deposited to a thickness of approximately 0.5 micron. Ohmic metal contacts are made to the top and bottom. These active layers are isolated by insulating $SiO_2$. A bias voltage is applied between the metal contacts.

BRIEF DESCRIPTION OF THE DRAWINGS

These and other objects, features, and details of the invention will become apparent in light of the ensuing detailed disclosure, and particularly in light of the drawings wherein.

DESCRIPTION OF THE PREFERRED EMBODIMENTS

Figure 1:
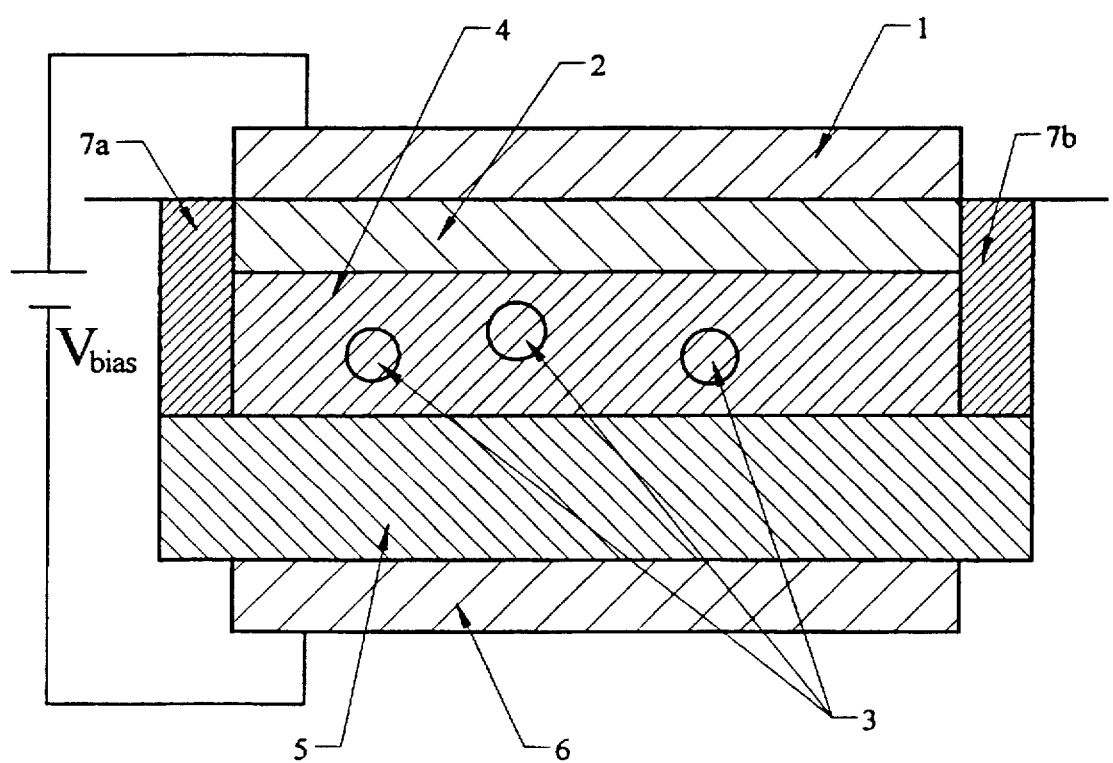
FIG. 1 illustrates a schematic view of the invention according to a preferred embodiment thereof.

FIG. 1 illustrates the invention according to a preferred embodiment. A thin layer (approximately 200 Angstroms thick) of amorphous silicon is deposited on a single crystal substrate 5, doped $N^+$. The amorphous silicon is simultaneously crystallized and oxidized at 800 degrees C in a 3:1 dry $N_2$ mixture at a total pressure of 1 atm. The result is a layer of amorphous $SiO_2$ 4 surrounding microclusters of crystalline silicon 3. A layer of n doped polycrystalline silicon 2 is deposited to a thickness of approximately 0.5 micron. This Si contact has a higher conduction band edge energy than a metal contact (as is utilized in certain prior art devices), which makes possible an NDR. Ohmic metal contacts 1, 6 are made to the top and bottom, respectively. These active layers are isolated by insulating $SiO_2$ 7a, 7b. A bias voltage $V_{bias}$ is applied between the metal contacts 1, 6.

As with RTD's (prior art), NDR in the present invention results from tunneling from a 3-dimensional electron gas through a resonant state in a lower-dimensional confined structure. In the case of an RTD, the confined structure is a 2-dimensional layer of semiconductor (the "quantum well"). In the case of the present invention, however, the confined structure is an irregular distribution of Si microclusters 3 in an insulating $SiO_2$ matrix 4.

If the polycrystalline Si layer 2 is doped $N^+$, the bias voltage $V_{bias}$ can be applied in either direction. As with an RTD, biasing this device in the NDR region of the I-V curve will result in self-excited oscillation.

The NDR in devices according to the invention results from simultaneous tunneling through an irregular array of a large number of microclusters. As a result, it is a device capable of large current densities as compared with prior art devices such as those which use resonant tunneling through "quantum dots".

Figure 2:
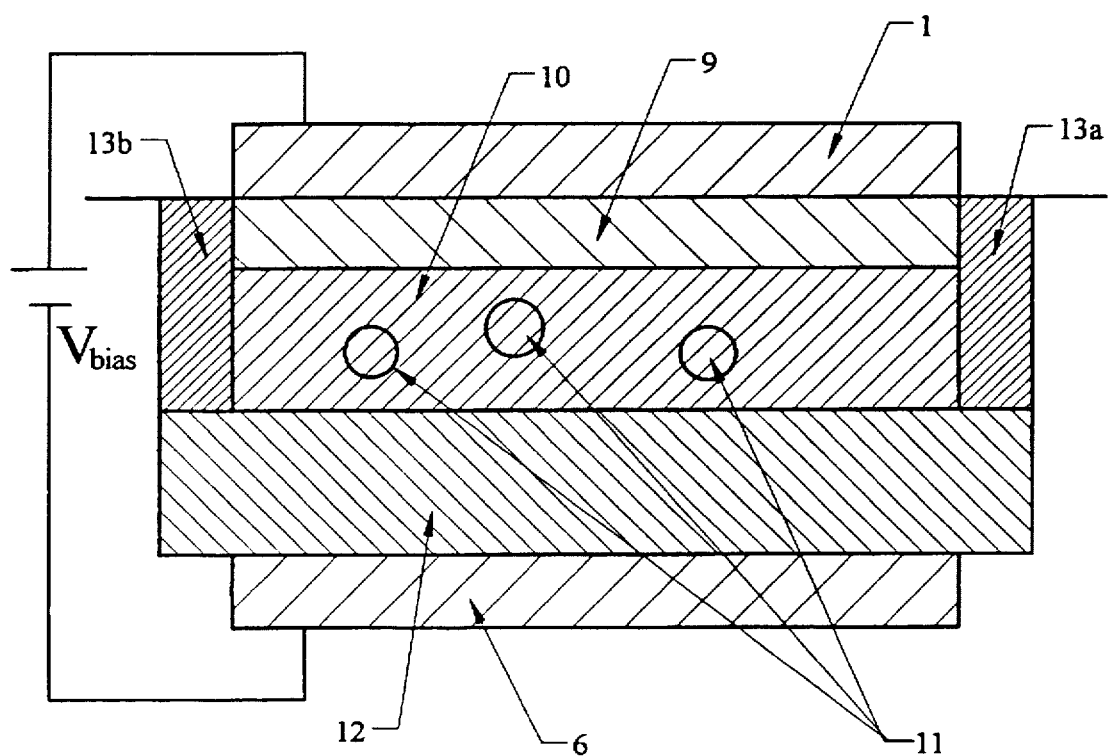
FIG. 2 illustrates a schematic view of the invention according to a second embodiment thereof.

An alternative embodiment of the invention is shown in FIG. 2. The microclusters 11 can be of a semiconductor or metal material. The insulating matrix 10 and the isolation material 13a, 13b, can be of an insulator or semiconductor, including insulating $SiO_2$ for insulating matrix 10, with a higher conduction band edge for tunneling. A semiconductor material can be used for the upper contact layer 9. A doped semiconductor can be used for the substrate 12. If layer 9 is doped, the bias voltage $V_{bias}$ can be applied in either polarity.

In order to observe NDR, the band edge energies of the tunneling carriers in layers 9, 10, and 12 and in the microclusters 11 should be related as described in S. Luryi, "Frequency Limit of Double-Barrier Resonant Tunneling Oscillators", Appl. Phys. Lett., Vol. 47, p. 490, which is incorporated herein by reference. The band edge energy of the insulator 10 should be substantially larger than the band edge energies of layers 9 and 12 and larger than the tunneling resonant state in the clusters 11, acting as a tunneling barrier. When unbiased, the energy of the tunneling resonant state of the clusters 11 should lie above the band edge energy of the contact layer 9 or 12 from which the carriers tunnel into the clusters 11. The person skilled in the art can readily apply these conditions in determining if a specific structure can exhibit NDR.

The growth and deposition of the microclusters according to the invention is a less-demanding technology than epitaxial growth. Thus, devices according to the invention have the potential for the extremely high frequency low noise applications of the RTD, but at lower cost and greater ease of integration in existing IC circuits. In particular, the invention in its silicon microcluster embodiment (see FIG. 1) has the capability for integration in existing silicon IC technology.

The invention can be applied to such applications as, e.g., self-exited oscillators, NDR amplifiers, self-exited mixers, and (Esaki) tunnel diodes. The device of the invention operates at higher frequencies and with higher power and better power efficiency than typical devices of the prior art with comparable operation capabilities.

What is claimed is:

1. A solid state electronic device having negative differential resistance, comprising:

a crystal substrate doped N+;

a layer of amorphous silicon dioxide surrounding microclusters of crystalline silicon;

an upper contact means comprising a polycrystalline silicon layer; and, first and second metal contact means for receiving a bias voltage.

2. The device according to claim 1, wherein said crystal substrate comprises a single crystal substrate.

3. The device according to claim 1, wherein said first and second metal contact means comprise first and second ohmic metal contacts, respectively.

4. The device according to claim 1, further comprising:

insulating silicon dioxide means for isolating active layers.

5. The device according to claim 1, wherein said layer of amorphous silicon dioxide has a thickness of approximately 200 Angstroms.

* * * * *